United States Patent
Yang et al.

(10) Patent No.: US 10,440,859 B1
(45) Date of Patent: Oct. 8, 2019

(54) VOLUME CONTROL DEVICE SUITABLE FOR UNINTERRUPTIBLE POWER SYSTEM

(71) Applicant: CYBER POWER SYSTEMS, INC., Taipei (TW)

(72) Inventors: Kai-Tsung Yang, Taipei (TW); Jui-Hung Chou, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 0 days.

(21) Appl. No.: 16/027,782

(22) Filed: Jul. 5, 2018

(30) Foreign Application Priority Data

Apr. 25, 2018 (CN) .......................... 2018 1 0380139

(51) Int. Cl.
*H05K 7/20* (2006.01)
*H02J 9/06* (2006.01)

(52) U.S. Cl.
CPC .......... *H05K 7/20209* (2013.01); *H02J 9/062* (2013.01); *H05K 7/20172* (2013.01); *H05K 7/20909* (2013.01); *H05K 7/20945* (2013.01)

(58) Field of Classification Search
CPC .......... H05K 7/20209; H05K 7/20281; H05K 7/20381; H05K 7/207; H05K 7/20836; H05K 7/20945; H05K 1/206
See application file for complete search history.

(56) References Cited

U.S. PATENT DOCUMENTS

| | | | | | |
|---|---|---|---|---|---|
| 6,427,103 | B2* | 7/2002 | Kobayashi | ......... | H05K 7/20209 123/41.49 |
| 6,725,132 | B2* | 4/2004 | Frankel | ............. | G05D 23/1902 361/695 |
| 6,801,004 | B2* | 10/2004 | Frankel | ..................... | H02P 6/08 318/268 |
| 6,931,306 | B2* | 8/2005 | Frankel | ................. | F04D 27/004 700/300 |
| 6,954,684 | B2* | 10/2005 | Frankel | ............. | G05D 23/1902 361/695 |
| 6,995,532 | B2* | 2/2006 | Frankel | ..................... | H02P 6/08 318/400.13 |
| 7,117,054 | B2* | 10/2006 | Frankel | ................. | F04D 27/004 700/97 |
| 7,305,316 | B2* | 12/2007 | Frankel | ............. | H05K 7/20209 318/471 |
| 7,605,556 | B2* | 10/2009 | Frankel | ............. | H05K 7/20209 318/400.07 |

(Continued)

FOREIGN PATENT DOCUMENTS

TW 201122234 A 7/2011
TW 201606202 A 2/2012

*Primary Examiner* — Robert J Hoffberg
(74) *Attorney, Agent, or Firm* — Bacon & Thomas, PLLC

(57) ABSTRACT

A volume control device suitable for an uninterruptible power system comprising a fan is provided. The volume control device comprises a user interface and a control circuit. The control circuit is electrically coupled to the fan and the user interface, and is used to receive a maximum operation volume setting value through the user interface. When the control circuit is ready to increase the rotation speed of the fan, it further determines whether the corresponding volume of the current rotation speed of the fan is less than the maximum operation volume setting value, and accordingly determines whether to adjust the rotation speed of the fan.

18 Claims, 9 Drawing Sheets

(56) References Cited

U.S. PATENT DOCUMENTS

| | | | | |
|---|---|---|---|---|
| 7,676,302 | B2* | 3/2010 | Frankel | F04D 27/004 700/300 |
| 7,711,439 | B2* | 5/2010 | Frankel | H05K 7/20209 361/688 |
| 7,941,231 | B1* | 5/2011 | Dunn | G06F 1/203 361/695 |
| 7,974,743 | B2* | 7/2011 | Nakashima | G06F 1/206 700/299 |
| 8,081,455 | B2* | 12/2011 | Sano | H05K 7/20209 236/49.3 |
| 8,594,858 | B2* | 11/2013 | Hung | F04D 27/004 318/471 |
| 9,110,642 | B2* | 8/2015 | Brey | G06F 1/3206 |
| 9,405,301 | B2* | 8/2016 | Montero | G06F 1/206 |
| 9,552,804 | B2* | 1/2017 | Costa | G06F 1/20 |
| 2003/0234625 | A1* | 12/2003 | Frankel | G06F 1/206 318/268 |
| 2004/0228091 | A1* | 11/2004 | Miyairi | H05K 7/20209 361/695 |
| 2017/0336839 | A1* | 11/2017 | Ho | G06F 1/206 |
| 2018/0067279 | A1* | 3/2018 | Veenman | F21V 29/508 |
| 2019/0008074 | A1* | 1/2019 | Chen | F04D 27/004 |

\* cited by examiner

VOLUME CONTROL DEVICE SUITABLE FOR UNINTERRUPTIBLE POWER SYSTEM

BACKGROUND OF THE INVENTION

Field of the Invention

The present invention relates to a volume control device, and more particularly, to a volume control device suitable for an uninterruptible power system.

Description of Related Art

An uninterruptible power supply (UPS) is used to provide backup power to devices (e.g., computers, servers, or medical equipment) when AC mains fails, so that the devices can still in normal operation in this case.

However, the cooling fan of the uninterruptible power system may generate annoying noise during operation (this noise is the main source of the operation volume of the uninterruptible power system), thereby interfering with people's daily life. It is a big problem for people with low noise tolerance.

SUMMARY OF THE INVENTION

An object of the present invention is to provide a volume control device suitable for an uninterruptible power system, which makes the operation volume of the uninterruptible power system not exceed a maximum operation volume setting value set by a user.

To achieve the above object, the present invention provides a volume control device suitable for an uninterruptible power system comprising a fan. The volume control device comprises a user interface and a control circuit. The control circuit is electrically coupled to the fan and the user interface, and is used to receive a maximum operation volume setting value through the user interface. When the control circuit is ready to increase the rotation speed of the fan, it further determines whether the corresponding volume of the current rotation speed of the fan is less than the maximum operation volume setting value, and accordingly determines whether to adjust the rotation speed of the fan.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
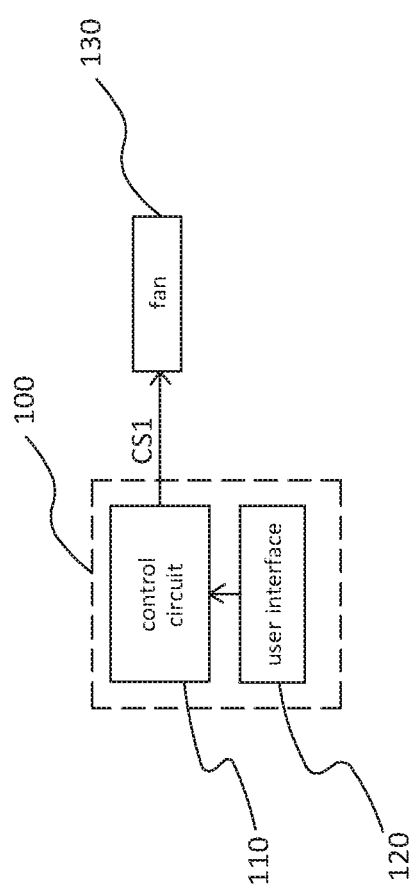
FIG. 1 shows a block diagram of a volume control device according to an embodiment of the invention.

FIG. 1 shows a block diagram of a volume control device according to an embodiment of the invention. Referring to FIG. 1, the volume control device 100 is suitable for an uninterruptible power system. The said uninterruptible power system comprises a fan 130. The volume control device 100 comprises a control circuit 110 and a user interface 120. The control circuit 110 is electrically coupled to the fan 130 and the user interface 120, and is used to receive a maximum operation volume setting value set by a user through the user interface 120. The maximum operation volume setting value is, for example, a decibel (dB) value, which represents the maximum operation volume that the user can accept.

Figure 2:
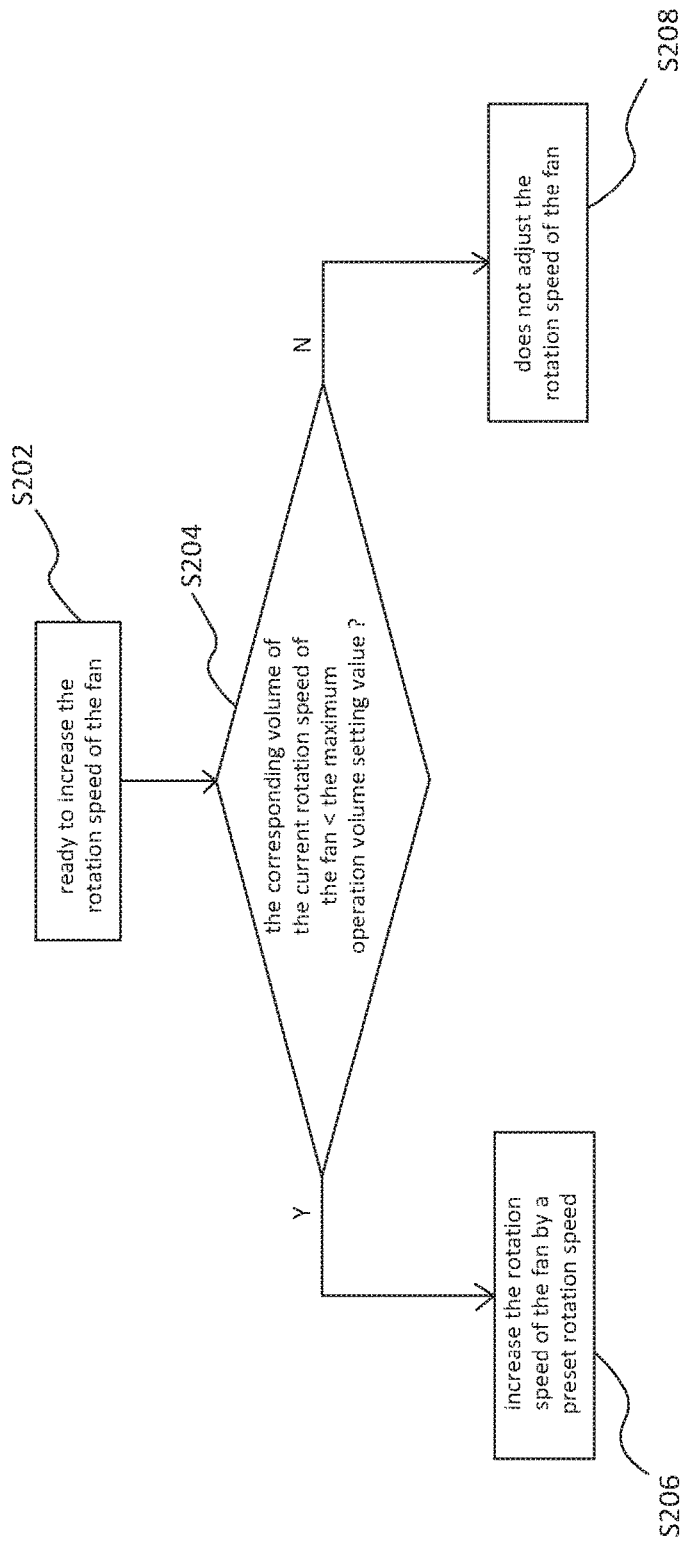
FIG. 2 is a flowchart illustrating an operation of a volume control device according to an embodiment of the present invention.

FIG. 2 is a flowchart illustrating an operation of a volume control device according to an embodiment of the present invention. Referring to FIGS. 2 and 1, when the control circuit 110 is ready to increase the rotation speed of the fan 130 (as shown in step S202), it further determines whether the corresponding volume of the current rotation speed of the fan 130 is less than the maximum operation volume setting value (as shown in step S204), and accordingly determines whether to adjust the rotation speed of the fan 130. In step S204, when the determination result is yes, it means that the corresponding volume of the current rotation speed of the fan 130 is still less than the maximum operation volume that the user can accept, the control circuit 110 increases the rotation speed of the fan 130 by a preset rotation speed (as shown in step S206). The preset rotation speed may be a preset ratio of the full speed of the fan 130, for example, 10% of the full speed of the fan 130. On the other hand, in step S204, when the determination result is no, it means that the corresponding volume of the current rotation speed of the fan 130 is greater than or equal to the maximum operation volume that the user can accept, the control circuit 110 does not adjust the rotation speed of the fan 130 (as shown in step S208).

The process shown in FIG. 2 can be used with an internal temperature of an uninterruptible power system to control the rotation speed of the fan, be used with an loading of uninterruptible power system to control the rotation speed of the fan, be used with other parameters of uninterruptible power system to control the rotation speed of the fan, or be used with the operation mode of the uninterruptible power system to control the rotation speed of the fan. The present invention is not limited thereto. The following embodiments will take the process shown in FIG. 2 to be used with at least an internal temperature of the uninterruptible power system to control the rotation speed of the fan for example.

Figure 3:
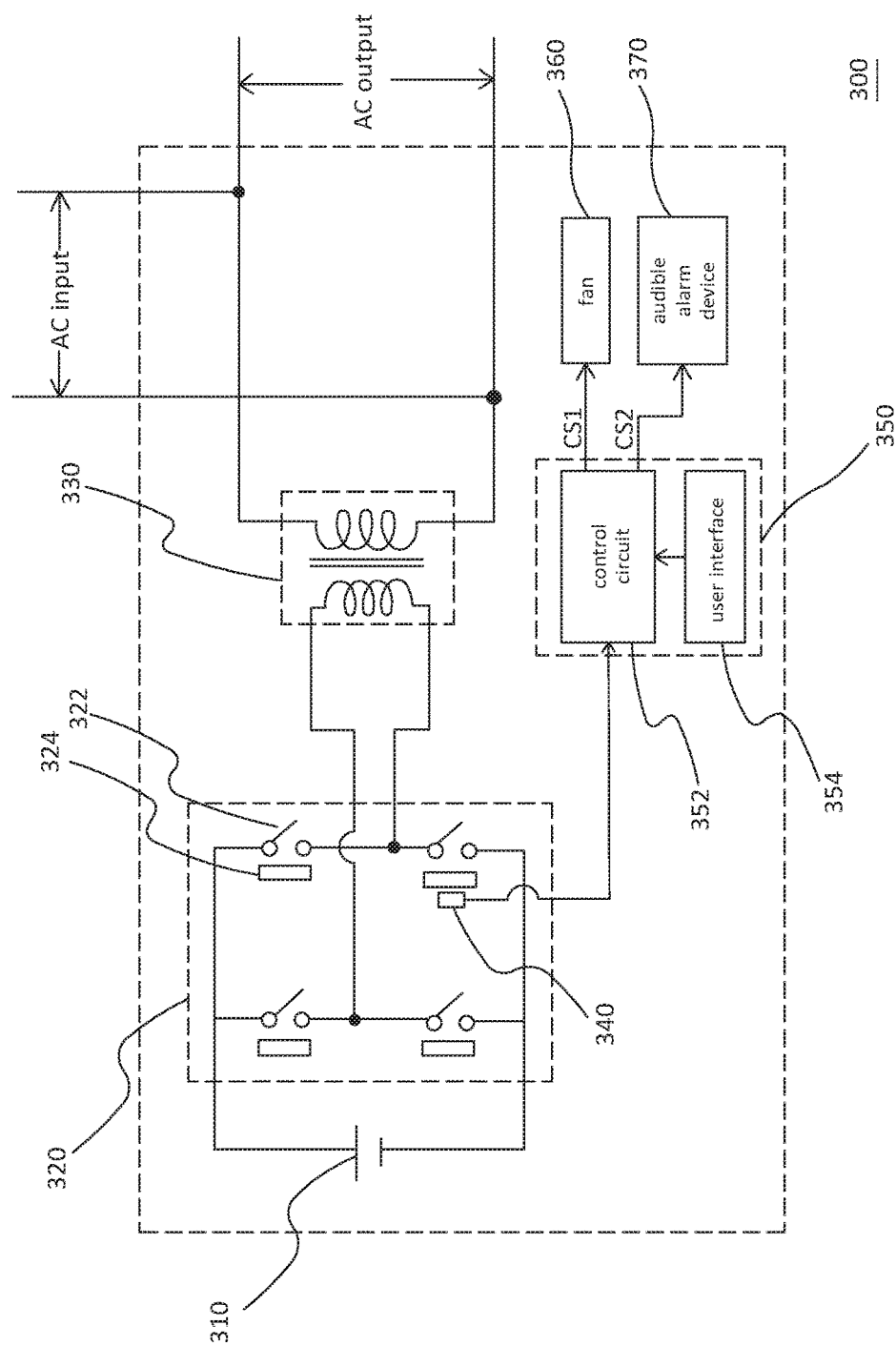
FIG. 3 is a block diagram of an uninterruptible power system comprising a volume control device according to an embodiment of the present invention.

FIG. 3 is a block diagram of an uninterruptible power system comprising a volume control device according to an embodiment of the present invention. As shown in FIG. 3, the uninterruptible power supply 300 comprises a battery 310, a DC-AC bidirectional conversion circuit 320, a transformer 330, a temperature sensor 340, a volume control device 350, a fan 360, and an audible alarm device 370. The DC-AC bidirectional conversion circuit 320 comprises a plurality of switches 322 and a plurality of heat sinks 324. The transformer 330 and the DC-AC bidirectional conversion circuit 320 are used to convert the AC input into a DC voltage to charge the battery 310. In addition, when the AC input (for example, the AC mains mentioned above) fails, the transformer 330 and the DC-AC bidirectional conversion circuit 320 are used to convert the DC voltage outputted from the battery 310 into an AC output, so as to provide the AC output to the devices requiring the AC output.

The temperature sensor 340 is used to be disposed adjacent to one of the beat sources in the uninterruptible power system 300. The heat source comprises the transformer 330 or one of the heat sinks 324. In FIG. 1, the temperature sensor 340 is disposed adjacent to one of the heat sinks 324. As for the volume control device 350, it comprises a control circuit 352 and a user interface 354. The control circuit 352 is electrically coupled to the switches 322 of the DC-AC bidirectional conversion circuit 320 (the coupling relationship between them is not shown) to control the on/off state of the switches 322. In addition, the control circuit 352 is also electrically coupled to the temperature sensor 340, the user interface 354, the fan 360, and the audible alarm device 370. The control circuit 352 is used to receive a maximum operation volume setting value inputted by a user through the user interface 354, and is used to measure the temperature of a heat source (in this example, a heat sink 324) through the temperature sensor 340.

In addition, the control circuit 352 is further used to provide the driving signals CS1 and CS2 to the fan 360 and the audible alarm device 370, respectively, so as to respectively control the operations of the fan 360 and the audible alarm device 370. The control circuit 352 stores the relationship between different voltages of the driving signal CS1, different rotation speeds of the fan 360, and different operation volumes of the fan 360, for example, a look-up table, or stores an equation relating the voltage of the driving signal CS1, the rotation speed of the fan 360, and the operation volume of the fan 360 for conversion. In addition, the control circuit 352 also stores the relationship between different voltages of the driving signal CS2 and different volumes of the audible alarm device 370, or stores an equation relating the voltage of the driving signal CS2 and the volume of the audible alarm device 370 for conversion.

In other embodiments, when the rotation speed of the fan 360 is controlled by a pulse width modulation signal (PWM signal) and the volume of the audible alarm device 370 is also controlled by a pulse width modulation signal, the driving signals CS1 and CS2 outputted by the control circuit 352 must be pulse width modulation signals. In these cases, the control circuit 352 is used to store the relationship between different duty cycles of the driving signal CS1, different rotation speeds of the fan 360, and different operation volumes of the fan 360, or stores an equation relating the duty cycle of the driving signal CS1, the rotation speed of the fan 360, and the operation volume of the fan 360 for conversion. In addition, the control circuit 352 is used to store the relationship between different duty cycles of the driving signal CS2 and different volumes of the audible alarm device 370, or stores an equation relating the duty cycle of the driving signal CS2 and the volume of the audible alarm device 370 for conversion.

Certainly, the above information stored by the control circuit 352 may also be stored by a memory (not shown). In this way, the control circuit 352 just needs to access these information stored in the memory instead of storing them.

Figure 4:
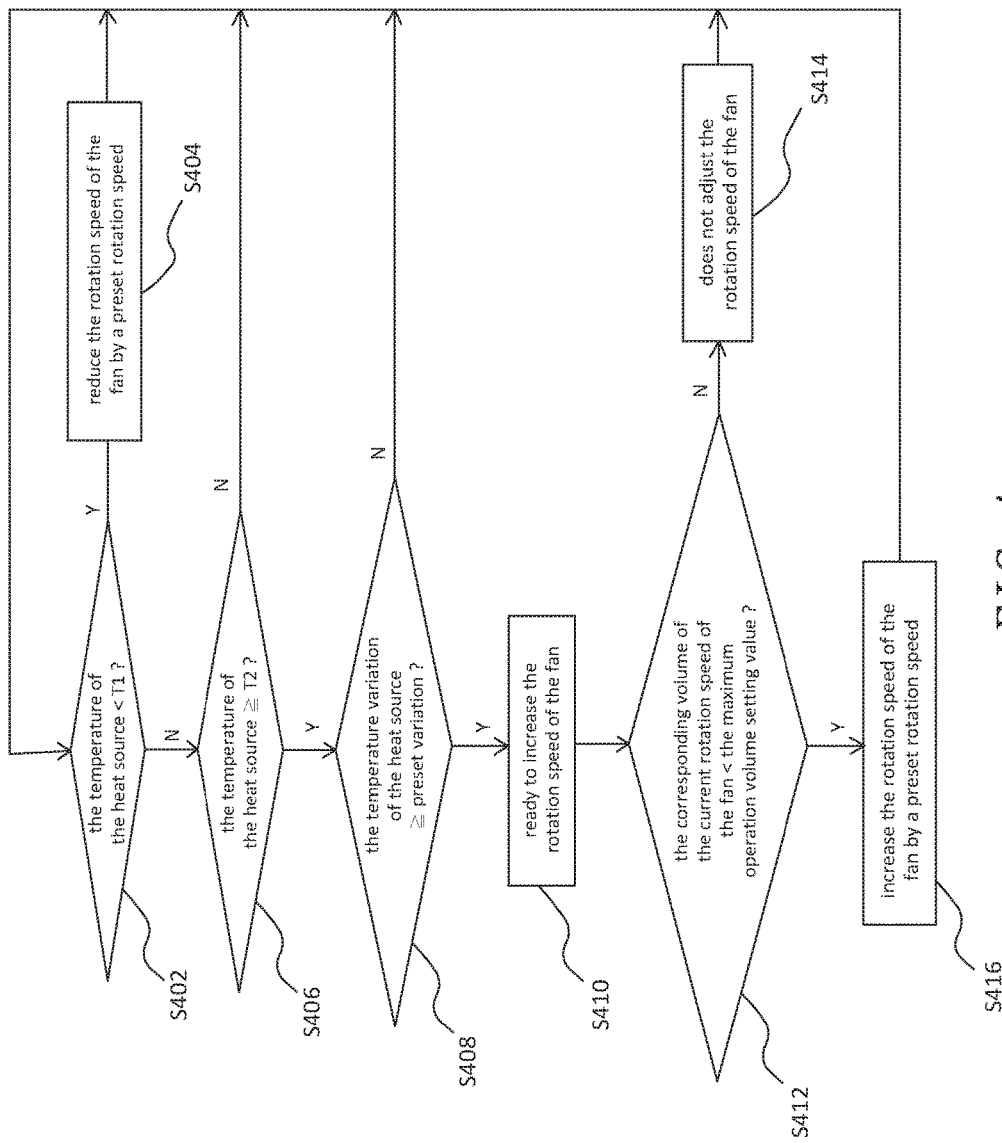
FIG. 4 is a flowchart illustrating an operation of the uninterruptible power system shown in FIG. 3.

FIG. 4 is a flowchart illustrating an operation of the uninterruptible power system 300 shown in FIG. 3. Referring to FIGS. 4 and 3, when the uninterruptible power system 300 is in operation, the control circuit 352 determines whether the temperature of the heat source is less than a preset temperature T1 (as shown in step S402). When the determination result is yes, the control circuit 352 controls the fan 360 by the driving signal CS1, so as to reduce the rotation speed of the fan 360 by a preset rotation speed (as shown in step S404). Then, the control circuit 352 returns to step S402. In step S402, when the determination result is no, the control circuit 352 determines whether the temperature of the heat source is greater than or equal to a preset temperature T2 (as shown in step S406), wherein the preset temperature T2 is greater than the preset temperature T1.

In step S406, when the determination result is no, the control circuit 352 returns to step S402. On the other hand, when the determination result is yes, the control circuit 352 determines whether the temperature variation of the above heat source is greater than or equal to a preset variation (as shown in step S408). In step S408, when the determination result is no, the control circuit 352 returns to step S402. On the other hand, when the determination result is yes, the control circuit 352 is ready to increase the rotation speed of the fan 360 (as shown in step S410). Then, the control circuit 352 determines whether the corresponding volume of the current rotation speed of the fan 360 is less than the maximum operation volume setting value inputted by the user (as shown in step S412). In step S412, when the determination result is no, the control circuit 352 does not adjust the rotation speed of the fan 360 (as shown in step S414), and then returns to step S402. On the other hand, when the determination result is yes, the control circuit 352 controls the fan 360 by the driving signal CS1, so as to increase the rotation speed of the fan 360 by a preset rotation speed (as shown in step S416).

Figure 5:
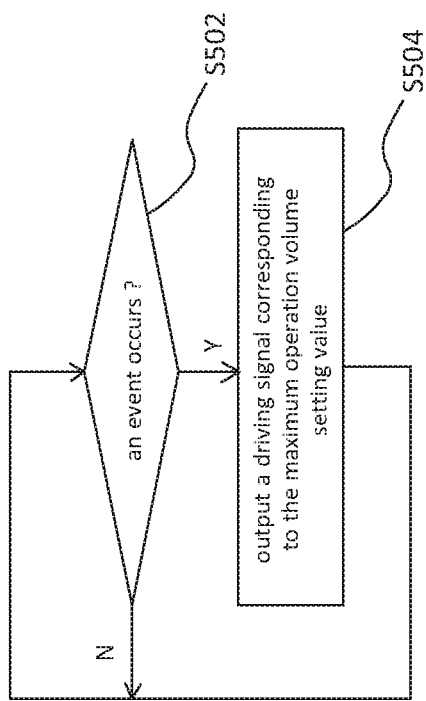
FIG. 5 is a flowchart illustrating an operation of the uninterruptible power system shown in FIG. 3.

FIG. 5 is a flowchart illustrating an operation of the uninterruptible power system 300 shown in FIG. 3. Referring to FIGS. 5 and 3, the control circuit 352 further determines whether an event (e.g., a fault event) occurs in the uninterruptible power system 300 at any time (as shown in step S502). In step S502, when the determination result is no, the control circuit 352 returns to step S502. On the other hand, when the determination result is yes, the control circuit 352 outputs the driving signal CS2 corresponding to the maximum operation volume setting value to drive the audible alarm device 370 to issue an alarm (as shown in step S504), and accordingly controls the volume of the alarm issued by the audible alarm device 370 to be limited to not exceed the maximum operation volume setting value set by the user.

From the operations shown in FIGS. 4 and 5, it can be seen that the corresponding volume of the rotation speed of the fan 360 and the volume of the alarm issued by the audible alarm device 370 are all limited to not exceed the maximum operation volume setting value set by the user. In other words, the operation volume of the uninterruptible power system 300 does not exceed the maximum operation volume setting value set by the user.

It is worth mentioning that, in FIG. 3, whether to adopt the audible alarm device 370 can be determined according to actual design requirements. In addition, in FIG. 4, whether to omit step S408 may also be determined according to actual design requirements.

Figure 6:
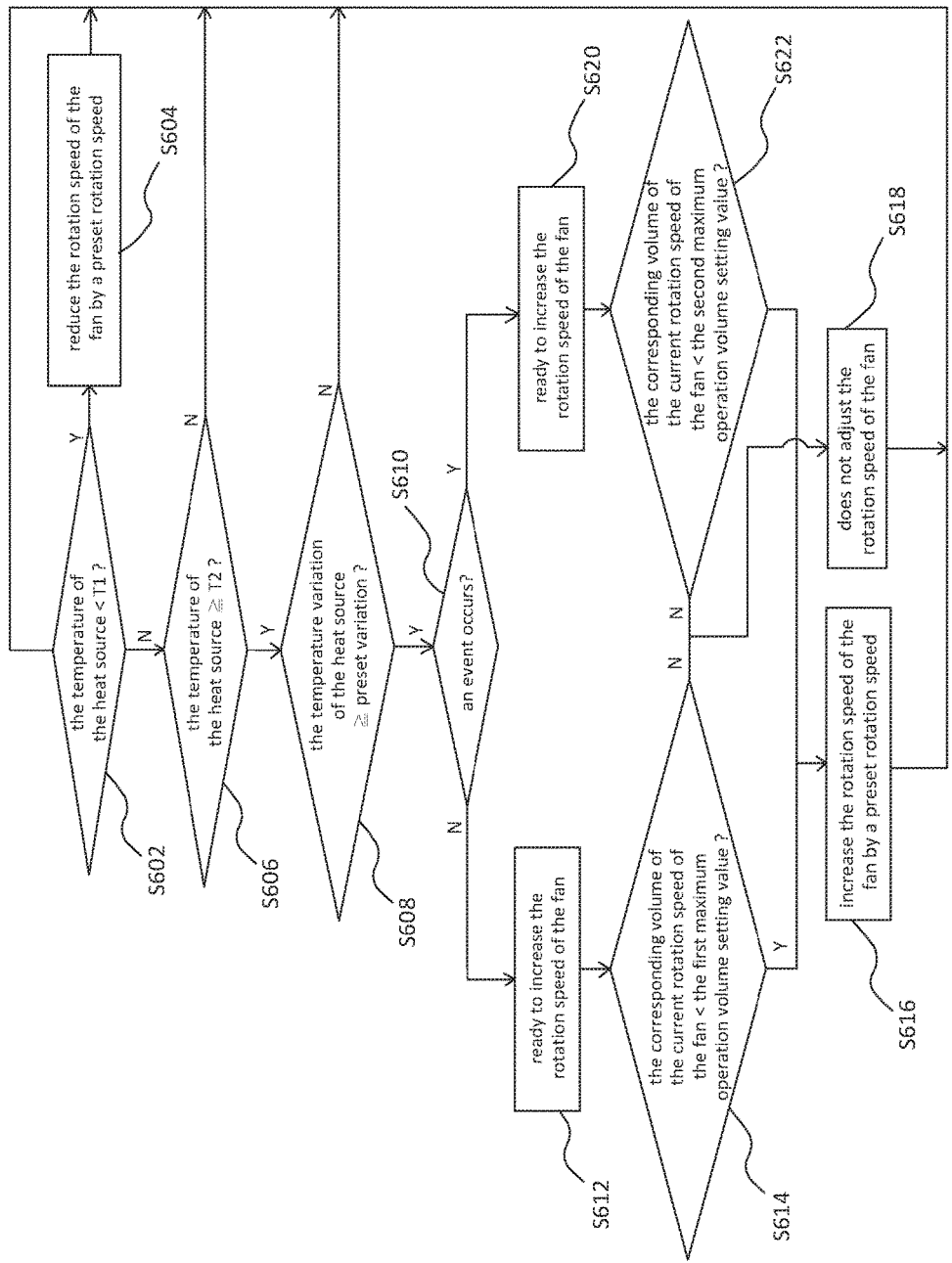
FIG. 6 is a flowchart illustrating another operation of the uninterruptible power system shown in FIG. 3.

FIG. 6 is a flowchart illustrating another operation of the uninterruptible power system 300 shown in FIG. 3. Referring to FIGS. 6 and 3, in this example, the control circuit 352 is used to receive a first maximum operation volume setting value and a second maximum operation volume setting value inputted by a user through the user interface 354, wherein the second maximum operation volume setting value is greater than the first maximum operation volume setting value. Compared with the operation shown in FIG. 4, the special features of the operation shown in FIG. 6 are the execution contents of steps S610, S614, and S622.

As shown in FIG. 6, in step S608, when the control circuit 352 determines that the temperature variation of the heat source is greater than or equal to a preset variation, it further determines whether an event (e.g., a fault event) occurs in the uninterruptible power system 300 (as shown in step S610). In step S610, when the control circuit 352 determines that no event occurs, the control circuit 352 is ready to increase the rotation speed of the fan 360 (as shown in step S612). Then, the control circuit 352 determines whether the corresponding volume of the current rotation speed of the fan 360 is less than the first maximum operation volume setting value (as shown in step S614). In step S614, when the determination result is no, the control circuit 352 does not adjust the rotation speed of the fan 360 (as shown in step S618), and then returns to step S602. On the other hand, when the determination result is yes, the control circuit 352 controls the fan 360 by the driving signal CS1, so as to increase the rotation speed of the fan 360 by a preset rotation speed (as shown in step S616).

In addition, in step S610, when the control circuit 352 determines that an event occurs, the control circuit 352 is also ready to increase the rotation speed of the fan 360 (as shown in step S620). Then, the control circuit 352 determines whether the corresponding volume of the current rotation speed of the fan 360 is less than the second maximum operation volume setting value (as shown in step S622). In step S622, when the determination result is no, the control circuit 352 does not adjust the rotation speed of the fan 360 (as shown in step S618), and then returns to step S602. On the other hand, when the determination result is yes, the control circuit 352 increases the rotation speed of the fan 360 by a preset rotation speed (as shown in step S616).

Further, in step S610, when the control circuit 352 determines that an event occurs, the control circuit 352 outputs the driving signal CS2 corresponding to the second maximum operation volume setting value to drive the audible alarm device 370 to issue an alarm, and accordingly controls the volume of the alarm issued by the audible alarm device 370 to be limited to not exceed the second maximum operation volume setting value set by the user. It is worth mentioning that, in FIG. 6, whether to omit step S608 can be determined according to actual design requirements.

Figure 7:
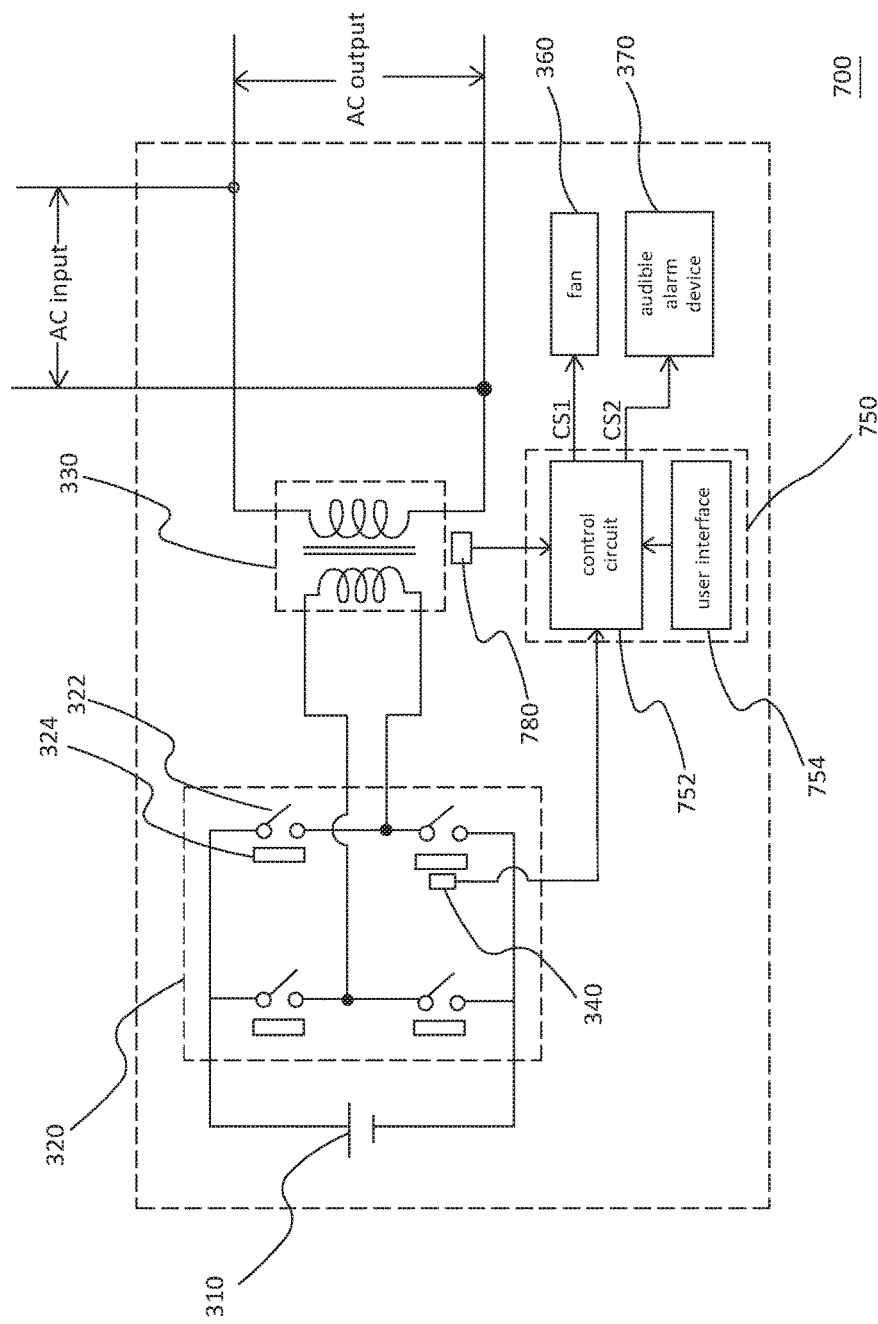
FIG. 7 is a block diagram of another uninterruptible power system comprising a volume control device according to an embodiment of the present invention.

FIG. 7 is a block diagram of another uninterruptible power system comprising a volume control device according to an embodiment of the present invention. In FIG. 7, the labels the same with the labels shown in FIG. 3 indicate the same objects or signals. Compared with the uninterruptible power system 300 shown in FIG. 3, the uninterruptible power system 700 shown in FIG. 7 adopts two temperature sensors, which are respectively labeled by 340 and 780, and the control circuit 752 in the volume control device 750 is electrically coupled to the temperature sensors 340 and 780. One of the temperature sensors is used to measure the temperature of a first heat source in the uninterruptible power system 700, and the other temperature sensor is used to measure the temperature of a second heat source in the uninterruptible power system 700. In this case, the first heat source is one of the transformer 330 and a heat sink 324, and the second heat source is the other one of the transformer 330 and the heat sink 324.

Figure 8:
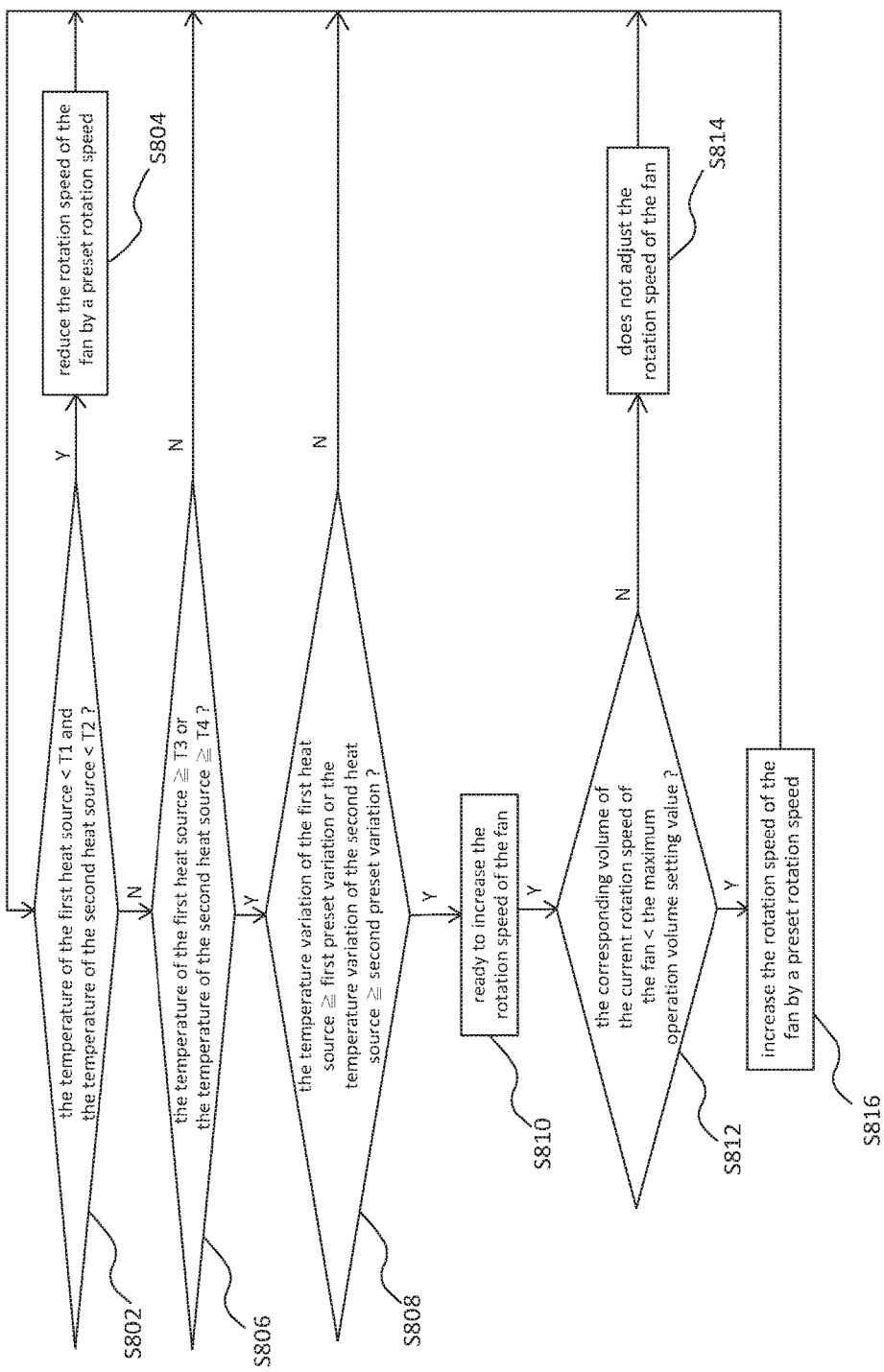
FIG. 8 is a flowchart illustrating an operation of the uninterruptible power system shown in FIG. 7.

FIG. 8 is a flowchart illustrating an operation of the uninterruptible power system 700 shown in FIG. 7. Referring to FIGS. 8 and 7, in this case, the control circuit 752 is used to receive a maximum operation volume setting value inputted by a user through the user interface 754. When the uninterruptible power system 700 is in operation, the control circuit 752 determines whether the temperature of the first heat source is less than a preset temperature T1, and determines whether the temperature of the second heat source is less than a preset temperature T2 (as shown in step S802). When the determination results are all yes, the control circuit 752 controls the fan 360 by the driving signal CS1, so as to reduce the rotation speed of the fan 360 by a preset rotation speed (as shown in step S804). Then, the control circuit 752 returns to step S802. In step S802, when any of the determination results is no, the control circuit 752 determines whether the temperature of the first heat source is greater than or equal to a preset temperature T3, and determines whether the temperature of the second heat source is greater than or equal to a preset temperature T4 (as shown in step S806), wherein the preset temperature T3 is greater than the preset temperature T1, and the preset temperature T4 is greater than the preset temperature T2.

In step S806, when the determination results are all no, the control circuit 752 returns to step S802. On the other hand, when any of the determination results is yes, the control circuit 752 determines whether the temperature variation of the first heat source is greater than or equal to a first preset variation, and determines whether the temperature variation of the second heat source is greater than or equal to a second preset variation (as shown in step S808). In step S808, when the determination results are all no, the control circuit 752 returns to step S802. On the other hand, when any of the determination results is yes, the control circuit 752 is ready to increase the rotation speed of the fan 360 (as shown in step S810). Then, the control circuit 752 determines whether the corresponding volume of the current rotation speed of the fan 360 is less than the maximum operation volume setting value inputted by the user (as shown in step S812). In step S812, when the determination result is no, the control circuit 752 does not adjust the rotation speed of the fan 360 (as shown in step S814), and then returns to step S802. On the other hand, when the determination result is yes, the control circuit 752 controls the fan 360 by the driving signal CS1, so as to increase the rotation speed of the fan 360 by a preset rotation speed (as shown in step S816).

Further, the control circuit 752 determines whether an event (e.g., a fault event) occurs in the uninterruptible power system 700 at any time. When the determination result is yes, the control circuit 752 outputs the driving signal CS2 corresponding to the maximum operation volume setting value to drive the audible alarm device 370 to issue an alarm, and accordingly controls the volume of the alarm issued by the audible alarm device 370 to be limited to not exceed the maximum operation volume setting value set by the user. It is worth mentioning that, in FIG. 8, whether to omit step S808 can be determined according to actual design requirements.

Figure 9:
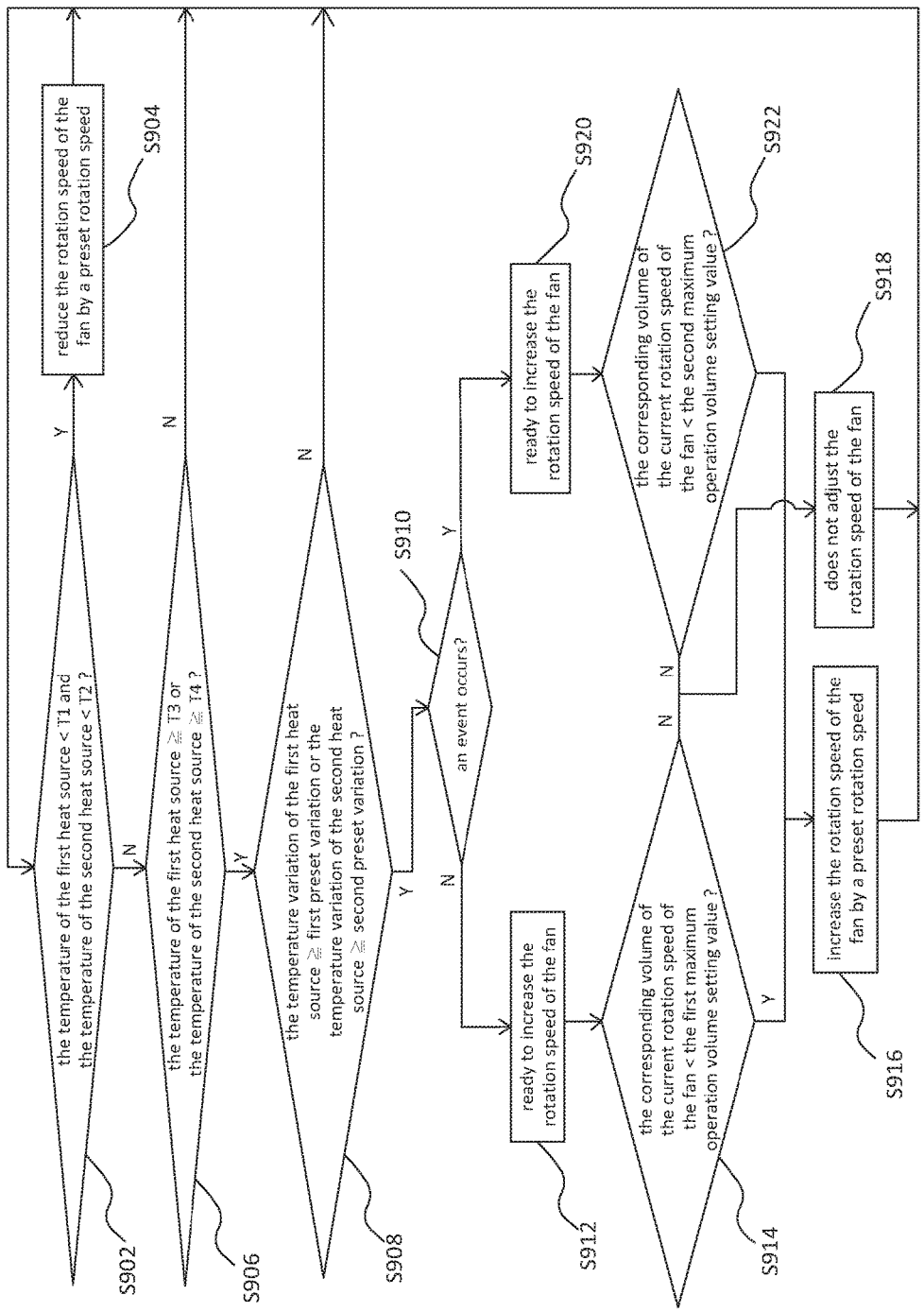
FIG. 9 is a flowchart illustrating another operation of the uninterruptible power system shown in FIG. 7.

FIG. 9 is a flowchart illustrating another operation of the uninterruptible power system 700 shown in FIG. 7. Referring to FIGS. 9 and 7, in this case, the control circuit 752 is used to receive a first maximum operation volume setting value and a second maximum operation volume setting value inputted by a user through the user interface 754, wherein the second maximum operation volume setting value is greater than the first maximum operation volume setting value. Compared with the operation shown in FIG. 8, the special features of the operation shown in FIG. 9 are the execution contents of steps S910, S914, and S922.

As shown in FIG. 9, in step S908, when any of the determination results is yes, the control circuit 752 further determines whether an event occurs in the uninterruptible power system 700 (as shown in step S910). In step S910, when the control circuit 752 determines that no event occurs, the control circuit 752 is ready to increase the rotation speed of the fan 360 (as shown in step S912). Then, the control circuit 752 determines whether the corresponding volume of the current rotation speed of the fan 360 is less than the first maximum operation volume setting value (as shown in step S914). In step S914, when the determination result is no, the control circuit 752 does not adjust the rotation speed of the fan 360 (as shown in step S918), and then returns to step S902. On the other hand, when the determination result is yes, the control circuit 752 controls the fan 360 by the driving signal CS1, so as to increase the rotation speed of the fan 360 by a preset rotation speed (as shown in step S916).

In addition, in step S910, when the control circuit 752 determines that an event occurs, the control circuit 752 is also ready to increase the rotation speed of the fan 360 (as shown in step S920). Then, the control circuit 752 determines whether the corresponding volume of the current rotation speed of the fan 360 is less than the second maximum operation volume setting value (as shown in step S922). In step S922, when the determination result is no, the control circuit 752 does not adjust the rotation speed of the fan 360 (as shown in step S918), and then returns to step S902. On the other hand, when the determination result is yes, the control circuit 752 controls the fan 360 by the driving signal CS1, so as to increase the rotation speed of the fan 360 by a preset rotation speed (as shown in step S916).

Further, in step S910, when the control circuit 752 determines that an event occurs, the control circuit 752 outputs the driving signal CS2 corresponding to the second maximum operation volume setting value to drive the audible alarm device 370 to issue an alarm, and accordingly controls the volume of the alarm issued by the audible alarm device 370 to be limited to not exceed the second maximum operation volume setting value set by the user. It is worth mentioning that, in FIG. 9, whether to omit step S908 can be determined according to actual design requirements.

It is worth mentioning that although all of the above embodiments are exemplified by a type of the uninterruptible power systems, this is not intended to limit the present invention. Those skilled in the art should know that the volume control device of the present invention can be applied to all types of uninterruptible power systems such as off-line type, on-line type, and line interactive type.

In summary, since the operation volume of the uninterruptible power system using the volume control device of the present invention does not exceed at least one maximum operation volume setting value set by the user, the interference from the operation volume of the uninterruptible power system to the daily life of the user is greatly reduced, especially for people with low noise tolerance.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A volume control device suitable for an uninterruptible power system comprising a fan, the volume control device comprising:
    a user interface; and
    a control circuit, electrically coupled to the fan and the user interface, and being used to receive:
        a first maximum operation volume setting value through the user interface, wherein when the control circuit is ready to increase a rotation speed of the fan, the control circuit further determines a first determination result of whether a corresponding volume of a current rotation speed of the fan is less than the first maximum operation volume setting value, and accordingly determines whether to adjust the rotation speed of the fan; and
        a second maximum operation volume setting value through the user interface, wherein the control circuit is further used to determine whether an event occurs in the uninterruptible power system,
    wherein when the control circuit determines that the event did not occur and is ready to increase the rotation speed of the fan, the control circuit further determines whether the corresponding volume of the current rotation speed of the fan is less than the first maximum operation volume setting value, and accordingly determines whether to adjust the rotation speed of the fan, and when the control circuit determines that the event did occur and is ready to increase the rotation speed of the fan, the control circuit further determines whether the corresponding volume of the current rotation speed of the fan is less than the second maximum operation volume setting value, and adjusts the rotation speed of the fan accordingly.

2. The volume control device of claim 1, wherein when the first determination result is no, the control circuit does not adjust the rotation speed of the fan, and when the first determination result is yes, the control circuit increases the rotation speed of the fan by a preset rotation speed.

3. The volume control device of claim 2, wherein the preset rotation speed is a preset ratio of a full speed of the fan.

4. The volume control device of claim 1, wherein the control circuit is further electrically coupled to a temperature sensor of the uninterruptible power system, and the control circuit measures a temperature of a heat source in the uninterruptible power system through the temperature sensor, when the control circuit determines that the temperature of the heat source is greater than or equal to a preset temperature, the control circuit is ready to increase the rotation speed of the fan.

5. The volume control device of claim 4, wherein the control circuit further determines whether a temperature variation of the heat source is greater than or equal to a preset variation, and the control circuit is ready to increase the rotation speed of the fan when the first determination result is yes.

6. The volume control device of claim 4, wherein the heat source comprises a transformer or a heat sink.

7. The volume control device of claim 1, wherein the control circuit is further electrically coupled to a first temperature sensor and a second temperature sensor of the uninterruptible power system, and is used to measure temperatures of a first heat source and a second heat source in the uninterruptible power system through the first temperature sensor and the second temperature sensor, respectively, when the control circuit determines that the temperature of the first heat source is greater than or equal to a first preset temperature or the temperature of the second heat source is greater than or equal to a second preset temperature, the control circuit is ready to increase the rotation speed of the fan.

8. The volume control device of claim 7, wherein the control circuit further determines a second determination result of whether a temperature variation of the first heat source is greater than or equal to a first preset variation, and determines a third determination result of whether a temperature variation of the second heat source is greater than or equal to a second preset variation, when any of the first, second or third determination results is yes, the control circuit is ready to increase the rotation speed of the fan.

9. The volume control device of claim 7, wherein the first heat source comprises one of a transformer and a heat sink, and the second heat source comprises another one of the transformer and the heat sink.

10. The volume control device of claim 1, wherein when the control circuit determines that the corresponding volume of the current rotation speed of the fan is less than the first maximum operation volume setting value or determines that the corresponding volume of the current rotation speed of the fan is less than the second maximum operation volume setting value, the control circuit increases the rotational speed of the fan by a preset rotational speed, and when the control circuit determines that the corresponding volume of the current rotational speed of the fan is greater than or equal to the first maximum operation volume setting value or determines that the corresponding volume of the current rotational speed of the fan is greater than or equal to the second maximum operation volume setting value, the control circuit does not adjust the rotation speed of the fan.

11. The volume control device of claim 10, wherein the preset rotation speed is a preset ratio of a full speed of the fan.

12. The volume control device of claim 1, wherein the control circuit is further electrically coupled to a temperature sensor of the uninterruptible power system, and the control circuit measures a temperature of a heat source in the uninterruptible power system through the temperature sensor, when the control circuit determines that the temperature of the heat source is greater than or equal to a preset temperature, the control circuit further determines whether the event did occur in the uninterruptible power system.

13. The volume control device of claim 12, wherein the control circuit further determines a second determination result of whether a temperature variation of the heat source is greater than or equal to a preset variation, and when the second determination result is yes, the control circuit further determines whether the event did occur in the uninterruptible power system.

14. The volume control device of claim 12, wherein the heat source comprises a transformer or a heat sink.

15. The volume control device of claim 1, wherein the control circuit is further electrically coupled to a first temperature sensor and a second temperature sensor of the uninterruptible power system, and is used to measure temperatures of a first heat source and a second heat source in the uninterruptible power system through the first temperature sensor and the second temperature sensor, respectively, when the control circuit determines that the temperature of the first heat source is greater than or equal to a first preset temperature or determines that the temperature of the second heat source is greater than or equal to a second preset temperature, the control circuit further determines whether the event did occur in the uninterruptible power system.

16. The volume control device of claim 15, wherein the control circuit further determines a second determination result of whether a temperature variation of the first heat source is greater than or equal to a first preset variation, and determines a third determination result of whether a temperature variation of the second heat source is greater than or equal to a second preset variation, when any of the first, second or third determination results is yes, the control circuit further determines whether the event did occur in the uninterruptible power system.

17. The volume control device of claim 15, wherein the first heat source comprises one of a transformer and a heat sink, and the second heat source comprises another one of the transformer and the heat sink.

18. The volume control device of claim 1, wherein the control circuit is further electrically coupled to an audible alarm device, and when the control circuit determines that the event did occur in the uninterruptible power system, the control circuit outputs a driving signal corresponding to the second maximum operation volume setting value to drive the audible alarm device.

* * * * *